(12) United States Patent
Quinn et al.

(10) Patent No.: US 9,142,778 B2
(45) Date of Patent: Sep. 22, 2015

(54) HIGH VACUUM OLED DEPOSITION SOURCE AND SYSTEM

(71) Applicant: Universal Display Corporation, Ewing, NJ (US)

(72) Inventors: William E. Quinn, Whitehouse Station, NJ (US); Siddharth Harikrishna Mohan, Plainsboro, PA (US); Gregory McGraw, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 39 days.

(21) Appl. No.: 14/081,161

(22) Filed: Nov. 15, 2013

(65) Prior Publication Data

US 2015/0140832 A1    May 21, 2015

(51) Int. Cl.
*H01L 51/40*     (2006.01)
*H01L 51/00*     (2006.01)
*C23C 14/04*     (2006.01)
*C23C 14/12*     (2006.01)
*H01L 51/56*     (2006.01)

(52) U.S. Cl.
CPC .......... *H01L 51/0011* (2013.01); *C23C 14/042* (2013.01); *C23C 14/12* (2013.01); *H01L 51/56* (2013.01)

(58) Field of Classification Search
CPC ... H01L 23/145; H01L 23/293; H01L 23/296; H01L 23/298; H01L 23/345; H01L 23/3737; H01L 27/32; H01L 27/3202; C23C 14/042; C23C 16/00
USPC ......... 438/82, 91, 99, 77, 477, 509, 515, 518, 438/780, 781, 700; 257/40, 642, 643, 759, 257/E21.006, E21.007, E21.077, E21.053, 257/E21.126, E21.127, E21.222, E21.259, 257/E21.267, E21.352
See application file for complete search history.

(56) References Cited

U.S. PATENT DOCUMENTS

| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |

(Continued)

FOREIGN PATENT DOCUMENTS

| WO | 2008057394 | 5/2008 |
| WO | 2010011390 | 1/2010 |

OTHER PUBLICATIONS

Baldo, et al., "Highly efficient phosphorescent emission from organic electroluminescent devices", Nature, vol. 395, pp. 151-154, 1998.

(Continued)

*Primary Examiner* — David Nhu
(74) *Attorney, Agent, or Firm* — Morris & Kamlay LLP

(57) ABSTRACT

Sources, devices, and techniques for deposition of organic layers, such as for use in an OLED, are provided. A vaporizer may vaporize a material between cooled side walls and toward a mask having an adjustable mask opening. The mask opening may be adjusted to control the pattern of deposition of the material on a substrate, such as to correct for material buildup that occurs during deposition. Material may be collected from the cooled side walls for reuse.

20 Claims, 11 Drawing Sheets

(56) References Cited

U.S. PATENT DOCUMENTS

| | | | |
|---|---|---|---|
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 * | 1/2002 | Forrest et al. ............ 427/64 |
| 6,468,819 | B1 | 10/2002 | Kim et al. |
| 7,279,704 | B2 | 10/2007 | Walters et al. |
| 7,431,968 | B1 | 10/2008 | Shtein et al. |
| 7,968,146 | B2 | 6/2011 | Wagner et al. |
| 8,343,278 | B2 * | 1/2013 | Sung et al. ............ 118/720 |
| 8,921,831 | B2 * | 12/2014 | Kim et al. ............ 257/40 |
| 2003/0230980 | A1 | 12/2003 | Forrest et al. |
| 2004/0174116 | A1 | 9/2004 | Lu et al. |
| 2011/0053301 | A1 | 3/2011 | Kang et al. |
| 2012/0225205 | A1 | 9/2012 | Yamazaki et al. |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

Chen, et al., "Simulation of the organic thin film thickness distribution for multi-source thermal evaporation process", Vacuum, vol. 85, pp. 448-451, 2010.

Hoffmann, "Depositing Equipment and Processes for OLED Lighting", Applied Materials, DOE SSL Manufacturing Workshop, Apr. 22, 2009.

Lee, "Simulation of the thin-film thickness distribution for an OLED thermal evaporation process", Vacuum, vol. 83, issue 5, pp. 848-852, Jan. 2009.

\* cited by examiner

HIGH VACUUM OLED DEPOSITION SOURCE AND SYSTEM

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) and, more specifically to systems and techniques for performing high-vacuum deposition of such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

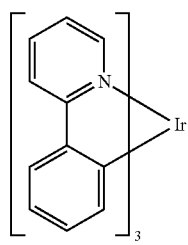

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, an "evaporator" or "sublimator" refers to a component that conveys a thermal change from a liquid or solid state to a gaseous state, respectively. Unless explicitly indicated to the contrary, either an evaporator or a sublimator may be used herein in each case in which one is mentioned, and each term may be used interchangeably with the other. More generally, each component may be referred to herein as a "vaporizer", and it will be understood that a "vaporizer" may include one or more evaporators and/or sublimators, though it need not include at least one of each.

More details on OLEDs, and the definitions described above, can be found in U.S. Pat. No. 7,279,704, which is incorporated herein by reference in its entirety.

SUMMARY OF THE INVENTION

A device according to an embodiment of the invention may include a thermal vaporizer and a mask assembly having an adjustable mask opening and disposed not more than a distance 5 W, not more than 4 W, or less from the first thermal vaporizer, wherein W is the width of the mask assembly. Cooled side walls may be disposed between the thermal vaporizer and the mask assembly and defining a material sublimation region. In some embodiments, the mask assembly may be disposed at least 100 μm-1 cm, at least 100 μm-1 mm, at least 500 μm-1 mm, or at least 1-5 mm from the material source. The mask assembly may include multiple components moveable relative to one another to adjust the area of the mask opening, each of which may be cooled. Thus, the mask opening may be adjustable between a fully closed position and an open position. When the mask opening is fully closed, source material provided by the thermal vaporizer may be entirely prevented from passing through the mask. In some configurations, the mask opening may have a maximum area of not more than 50% of the area of the mask.

In an embodiment, the thermal vaporizer may include a material source disposed within the thermal vaporizer. The material source may include an organic material, and may include multiple materials.

In an embodiment, multiple vaporizers may be used, each of which may be configured to vaporize a separate material. For example, host and dopant materials may be vaporized by separate vaporizers. In another example, separate materials for individual colors in an OLED may be vaporized by separate vaporizers. Each may vaporize material between the cooled side walls, or multiple sets of cooled side walls may be disposed between the vaporizers and the mask assembly, each disposed above and associated with an individual vaporizer. The temperature, vapor pressure, and other attributes of each vaporizer may be individually controllable.

In an embodiment, a deposition system may include a deposition device as described herein and a target substrate. The mask assembly of the deposition device, or of each deposition device in the system, may have an area less than the area of the target substrate. The mask assembly may be disposed within about 100 μm-1 mm of the target substrate. The vaporizer and the substrate may be moveable relative to one another.

Embodiments of the invention also include techniques of operating devices as described herein. For example, an embodiment may include vaporizing a material between cooled side walls and toward a mask assembly having an adjustable mask opening and disposed not more than a distance 5 W from the first material, where W is the width of the mask assembly. The size of the mask opening may be adjusted while the material is vaporized, and the vaporizer and the substrate may be moved relative to one another while the material is vaporized, such as to raster the material being deposited.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
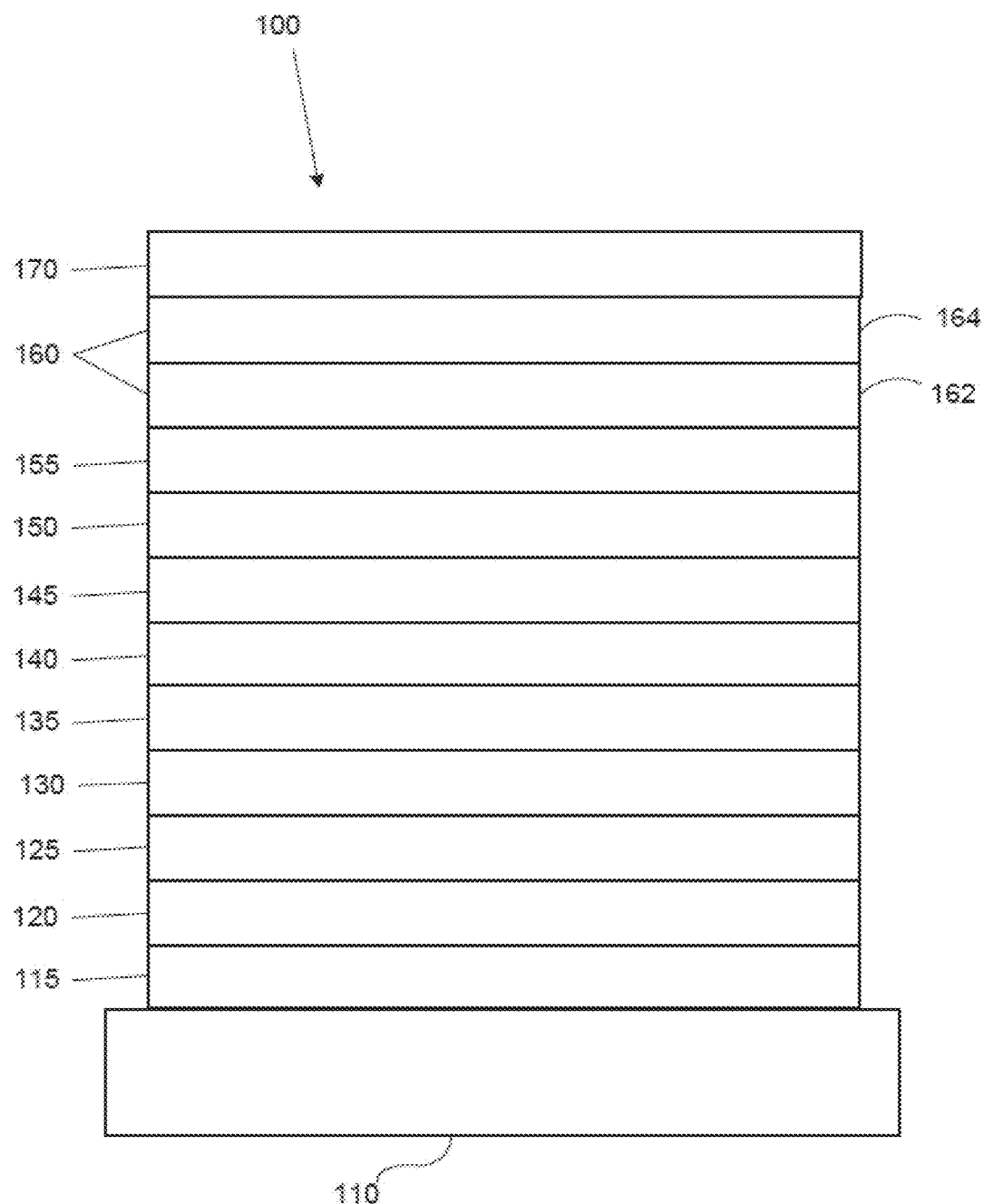
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
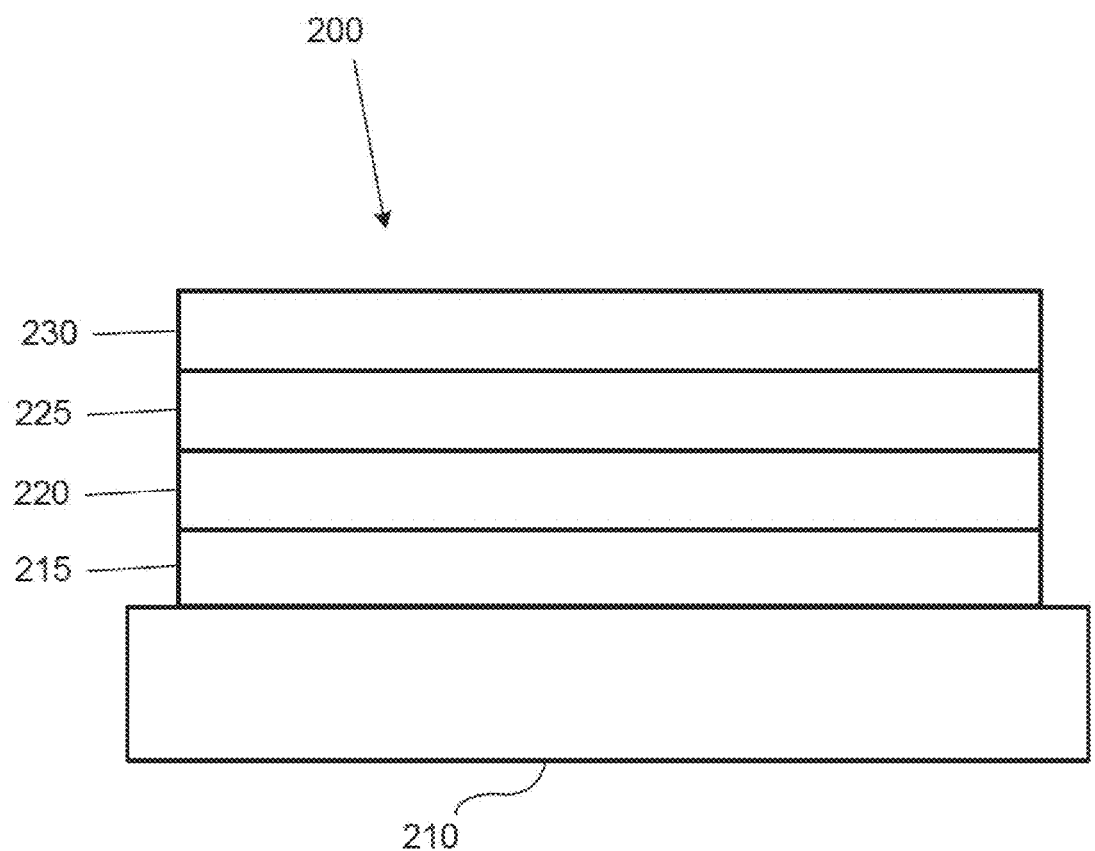
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, aralkyl, heterocyclic group, aryl, aromatic group, and heteroaryl are known to the art, and are defined in U.S. Pat. No. 7,279,704 at cols. 31-32, which are incorporated herein by reference.

Small molecule organic materials used in OLED systems such as large-area OLED displays and lighting panels often are deposited from solution or by vacuum deposition. In many cases, such as full-color displays, multi-color light panels, and the like, the light-emitting region of these devices may be divided into small pixels. It typically is desirable to confine light emitting materials for each color to individual pixels, because mixing of the materials can change the hue, efficiency and lifetime of the device.

Conventional techniques to pattern and deposit organic materials for OLED displays and lighting include evaporating the organic material to be deposited through a shadow mask. This method may perform acceptably well for relatively small displays and lighting panels. However, at larger substrate sizes, the use of thin evaporation masks may become more difficult due to flexing of the masks and expansion of the masks due to thermal effects during deposition. Similarly, movement of the mask during deposition may cause registration issues with the substrate and evaporated or sublimated material may deposit in areas other than the intended pixel. Flexing can also cause contact between the mask and the substrate and cause damage to the delicate surface. Often a thin metal mask may expand and distort during deposition due to heating from the evaporated materials, and such expansion becomes more pronounced as the mask size grows. To minimize the effects of mask expansion and flexing, a smaller mask can be used. Generally the smaller mask is considerably smaller than the substrate, and thus must be stepped or scanned across the surface of the substrate, while the material to be deposited is confined to the open areas of the mask.

Conventional deposition sources typically operate at a relatively moderate vacuum level, and place the evaporator relatively close to the shadow mask. It is generally desirable for the evaporated molecules to form a beam, i.e., to travel generally in a straight line, from the surface of the evaporation source to the mask. In this way, the openings in the mask will allow the evaporated molecules to deposit on the substrate only where there are openings in the mask, and areas of the mask which are blocked will prevent deposition on the substrate. By placing the evaporator close to the mask to improve source utilization, conventional techniques often result in molecular beams having a higher divergence than if the evaporator was placed farther from the mask. To compensate for divergence, the mask opening must be made smaller, which negates some of the utilization improvement gained by placing the evaporator close to the mask or the mask must be placed very close to the substrate. By operating the source at vacuum levels where the mean free path of evaporated molecules is less than the dimensions of the source housing, the evaporated molecule generally behave more in the manner of streams of gas, rather than beams, with divergence resulting from molecular collisions. Collisions between molecules increase the divergence beyond the high vacuum beam forming conditions previously described.

To decrease beam divergence, various steering structures may be placed in the path of evaporated material, to redirect and confine divergent molecules into a desired path. This evaporated material may elastically bounce off the steering structure, which will not result in any beam steering, or the evaporated material molecules may adsorb on the surface of the steering structure, thus reducing material utilization. An alternative solution for limiting beam divergence is to increase the distance between the mask and substrate.

Another alternative technique for depositing larger-scale devices is provided in US Patent Publication No. 2011/0053301, the disclosure of which is incorporated by reference in its entirety. However, in contrast to the arrangements described in the '301 application, systems and techniques disclosed herein may place the sublimation source farther from the substrate to control lateral spread of material through the shadow mask. Further, the walls of the deposition source may be actively cooled to prevent re-sublimation of condensed material. The mask also may cover a relatively smaller area than the glass substrate to minimize mask distortion. Active cooling of the source walls may allow for efficient condensation of the source material which can be subsequently re-processed for reuse. In some embodiments, a smaller mask assembly as disclosed herein may include movable openings which can be adjusted to compensate for mask coating, or can be occluded to act as a shutter for the source.

The present disclosure provides techniques and systems for vacuum deposition organic materials for use in OLEDs, in which each of the organic materials may be deposited primarily or entirely on individual pixel areas with little or no contamination of neighboring pixels. The evaporation source assembly contains a heated material vaporizer, a chilled housing to condense divergent evaporated material, and a mask to define the pixel areas. The source assembly may be smaller than the display or lighting panel, and may be moved relative to the substrate to completely cover the substrate surface. The mask used to define the pixel areas may be adjustable, such as to compensate for coating to minimize mask cleaning, as described in further detail herein.

Sources used in embodiments of the invention may operate in a vacuum environment where the mean free path in the sublimation region between the vaporizer and mask/shutter assembly is larger than the distance from the source to the mask. In such a configuration, the source typically is in a molecular flow regime, as opposed to a viscous flow regime. In molecular flow, molecules leaving the source travel in straight lines until they collide with the wall of the chamber, the mask, shutter or substrate. The chance of colliding with another gas molecule generally is small, and therefore molecules leaving the vaporizer behave like a beam.

Figure 3:
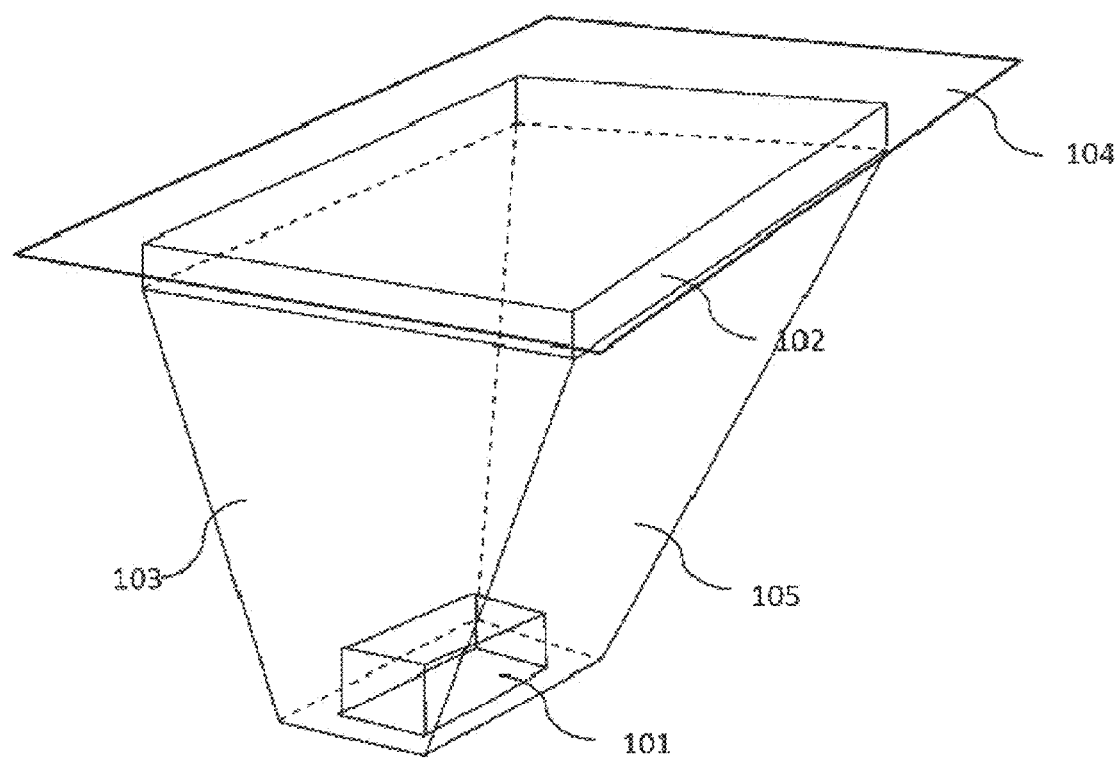
FIG. 3 shows a schematic diagram of a thermal vaporizer and a mask assembly according to an embodiment of the invention.

FIG. 3 shows an example arrangement according to an embodiment of the invention. A deposition source disposed near the surface of the substrate 104 contains 3 main elements, a vaporizer 101, a mask 102 having an adjustable mask opening, and cooled sidewalls 103, 105 that are disposed between the vaporizer and the mask assembly. For a mask assembly having a width W, the mask assembly may be disposed not more than 5 W, not more than 4 W, or less away from the thermal vaporizer, as measured normal to the mask assembly. Such a distance may allow for the opening of the vaporizer cell and the mask to be sufficiently large to provide acceptable thickness uniformity form center the edge of the mask.

To achieve a +/−2% thickness uniformity (range/mean), it may be desirable for the beam divergence to be less than about 12 degrees. This angle may be used to define the source to mask distance ratio. Because the majority of material sublimated from the source will be incident on the sidewalls of the source assembly, the sidewalls may be actively cooled to condense sublimated material. If the material is not condensed, the material may recoil from the wall, and the beam nature of the sublimated material will be reduced or lost. Similarly, if the material is adsorbed on a sidewall surface, but the surface is warm, the material may desorb from the surface with a random angle, and the beam nature of the sublimated material may be reduced or lost.

Figure 4:
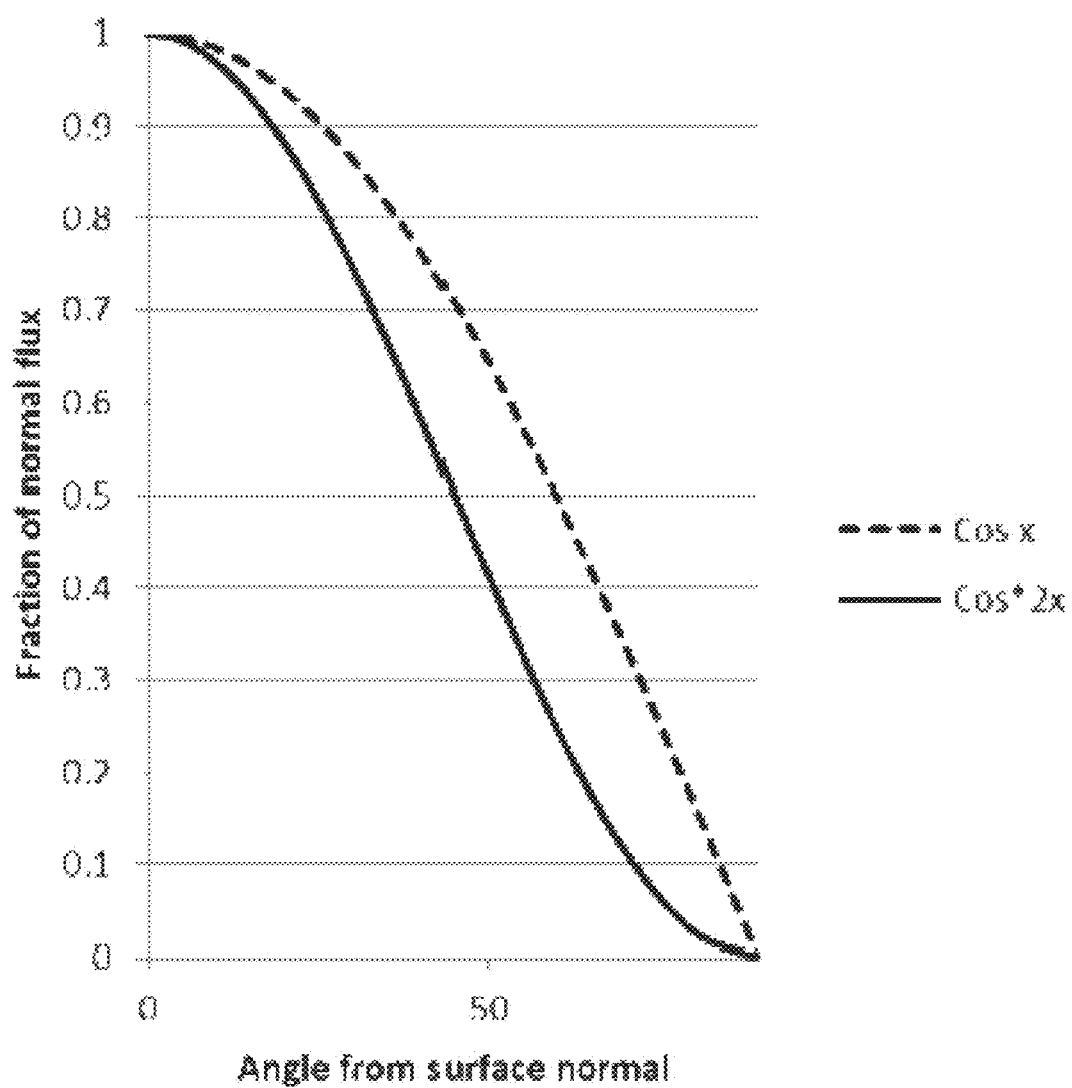
FIG. 4 shows cosine and cosine-square distribution from an effusion source according to an embodiment of the invention.

The spatial distribution of molecules entering the gas area above a solid can be approximated by a cosine or cosine-square ($\cos^2$) distribution rotated about the normal to the surface of the solid as shown in FIG. 4. This distribution may be used to determine the source to substrate distance, as the distance will control the thickness uniformity of the evaporated film. From FIG. 4, it can be seen that to maintain about a +/−2% thickness uniformity in the evaporated film, the included angle of deposition should be less than about 8 degrees from the surface normal for a source with a cosine-square distribution, and less than about 12 degrees for a source with cosine distribution. From the deposition angle, the source to substrate distance may be determined. As previously described, this distance may be proportional to the mask dimensions, indicating that a distance of less than about 5 W may be preferred for a mask of width W. By controlling the divergence of the depositing beam of material, the mask to substrate distance may be increased to distances which are relative easy to control while maintaining relatively small deviations in substrate planarity. More specifically, in various embodiments of the present invention, the mask assembly may be disposed at least 100 µm-1 cm from the thermal vaporizer, at least 100 µm-1 mm from the material source, at least 500 µm-1 mm from the material source, or at least 1-5 mm from the material source. Larger distances may be particularly useful, for example, in configurations in which the source assembly is rastered to cover the surface of a relatively large substrate and the raster line widths can be relatively large, such as during fabrication of lighting panels.

Figure 5:
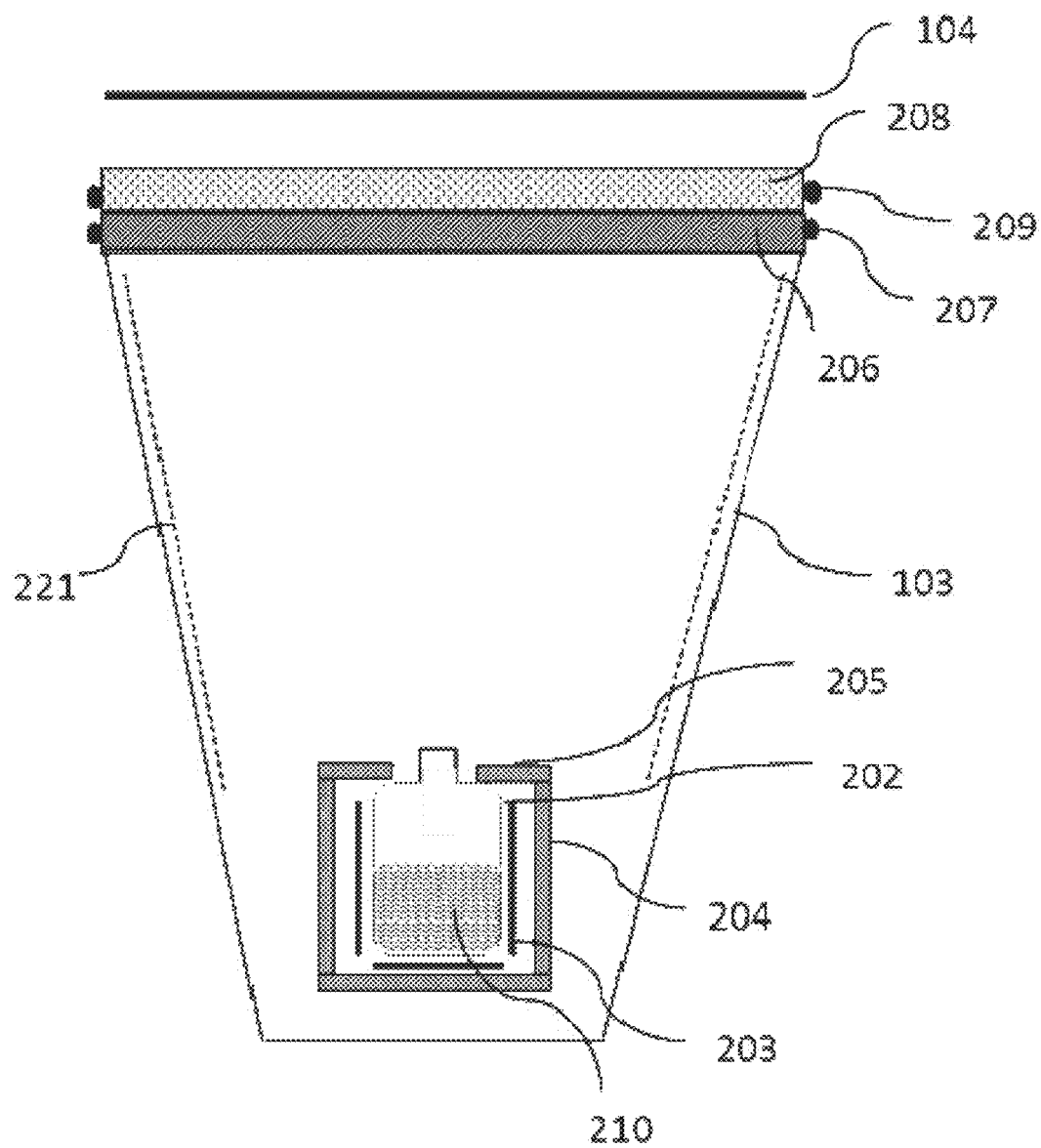
FIG. 5 shows a schematic side view of a deposition device according to embodiments of the invention.
Figure 6A:
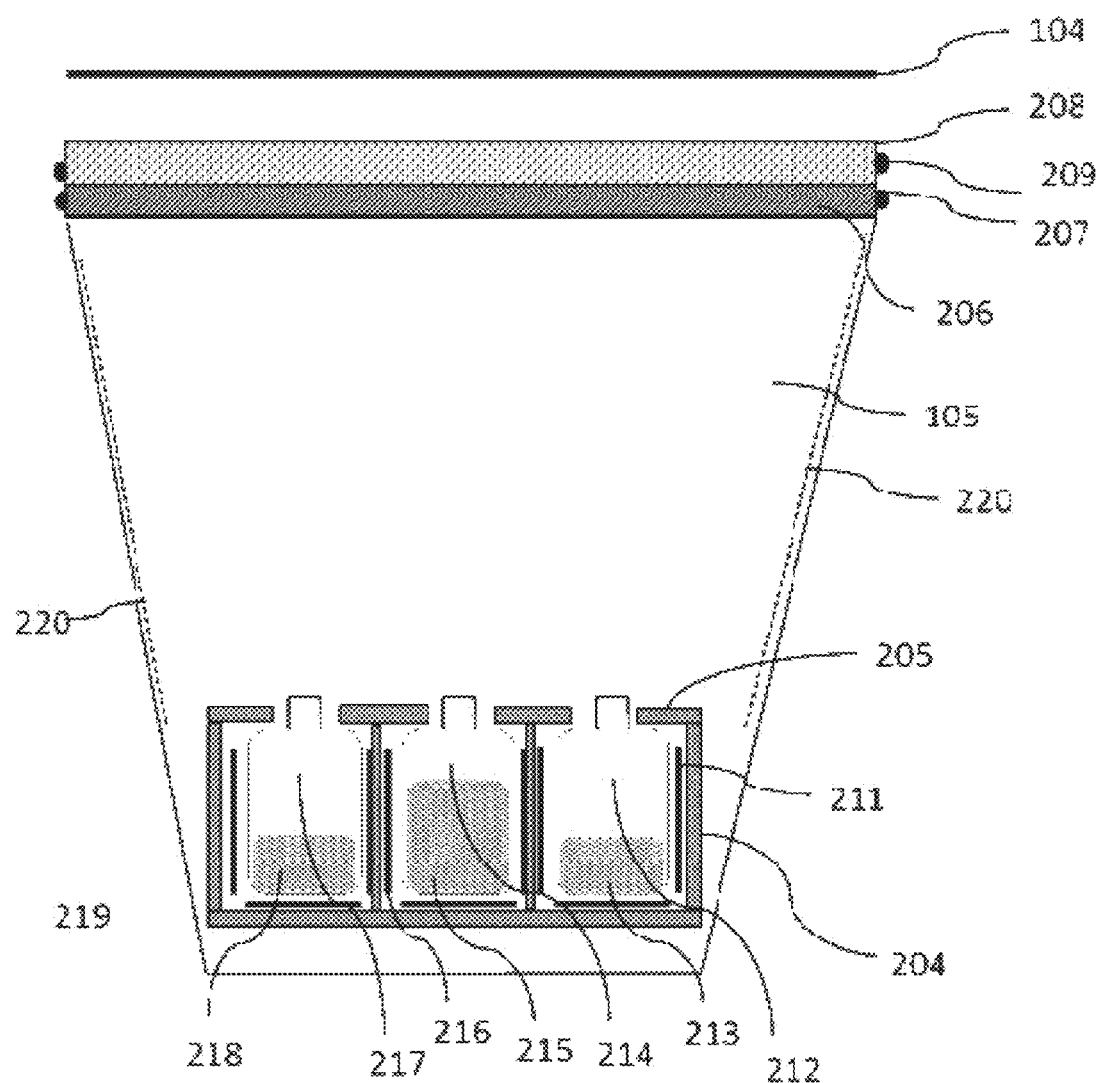
FIG. 6A shows a schematic side view of a deposition device according to embodiments of the invention.
Figure 6B:
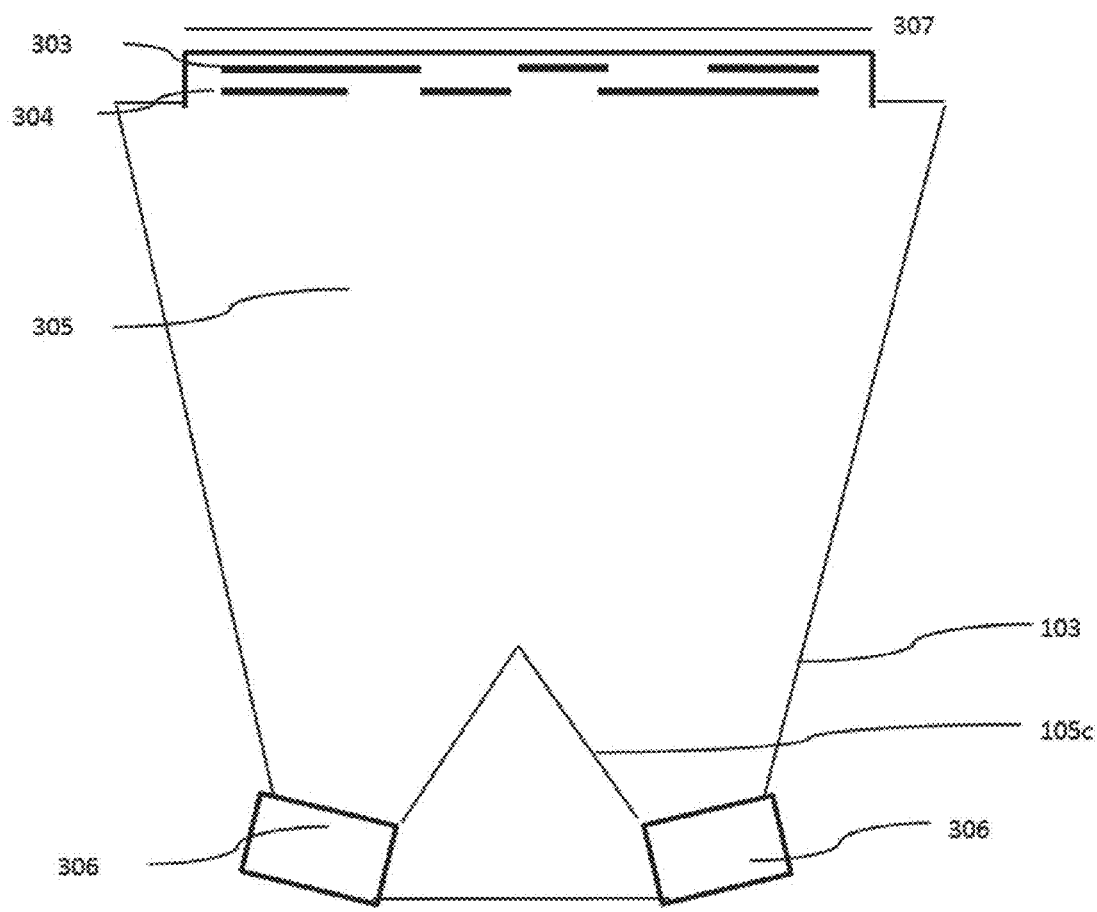
FIG. 6B shows a schematic view of a multiple source deposition device according to embodiments of the invention.

FIGS. 5, 6A, and 6B show schematic side views of a deposition device according to embodiments of the invention. A device may include multiple vaporizers 202, 212, 214, 217 for depositing multiple materials 218, 215, 213, as shown in FIGS. 6A and 6B. Each vaporizer may have an independent heater 203, 211, 216, 219, respectively, as well as independent control and power components such as temperature monitoring thermocouples and power supplies. Thus, the temperature, vapor pressure, and/or other characteristics of each vaporizer may be independently controlled. The vaporizers may be surrounded by insulating structures 204, which may include, for example, a removable cover 205 to facilitate filling and servicing of the crucibles. Similarly, insulating material may separate the individual vaporizers 212, 214, 217 and heaters 211, 216, 219 so that each may be maintained at a different temperature. The number of vaporizers may be modified for deposition of a single material or multiple materials, such as a host and dopant. Since each vaporizer may be heated to different temperatures, the flux from each may be adjusted to provide a desired composition of the resulting deposited film.

Arrangements such as shown in FIGS. 5, 6A, and 6B may form a chamber with side walls 103a, 103b, 105a, 105b. The mask assembly may form a top of the chamber, and the vaporizer assembly and/or additional support structure may form the bottom of chamber. In such a configuration, the sidewalls may function as support members for the vaporizer assembly and as chilled surfaces to condense sublimated material which deposits on the walls. The wall surfaces may be covered by or include removable shields 220, 221 which may be removed during maintenance to facilitate re-use of evaporated material and increase source material utilization. For example, after a deposition process is performed, the shields 220, 221 may be removed and sublimated material deposited on the shields may be collected for reuse. Similarly, material may be collected directly from the interior wall surfaces if separate shields are not used. The vaporizer is shown in a vertical deposition configuration for illustration, though one of skill in the art will understand that a horizontal deposition configuration also may be used by changing the configuration of the vaporizer assembly. FIG. 6B shows an alternative arrangement with active cooling surfaces 105c between the sources. As shown, one or more cooling surfaces may be disposed adjacent to and/or between the vaporizers, so as to form the sublimation zone between the vaporizers and the substrate. The surfaces 105c and/or vaporizers 306 may be disposed at an angle relative to the substrate, for example to direct vaporized material more directly toward the center region of the substrate, to prevent or reduce additional buildup on other side walls, or the like.

Figure 7A:
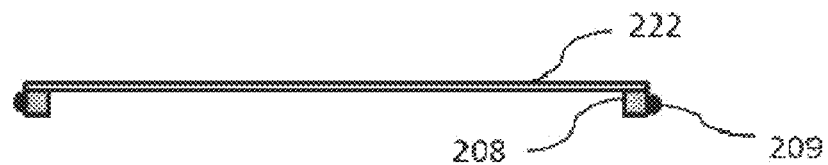
FIG. 7A shows a side view of an example mask assembly according to an embodiment of the invention
Figure 7B:
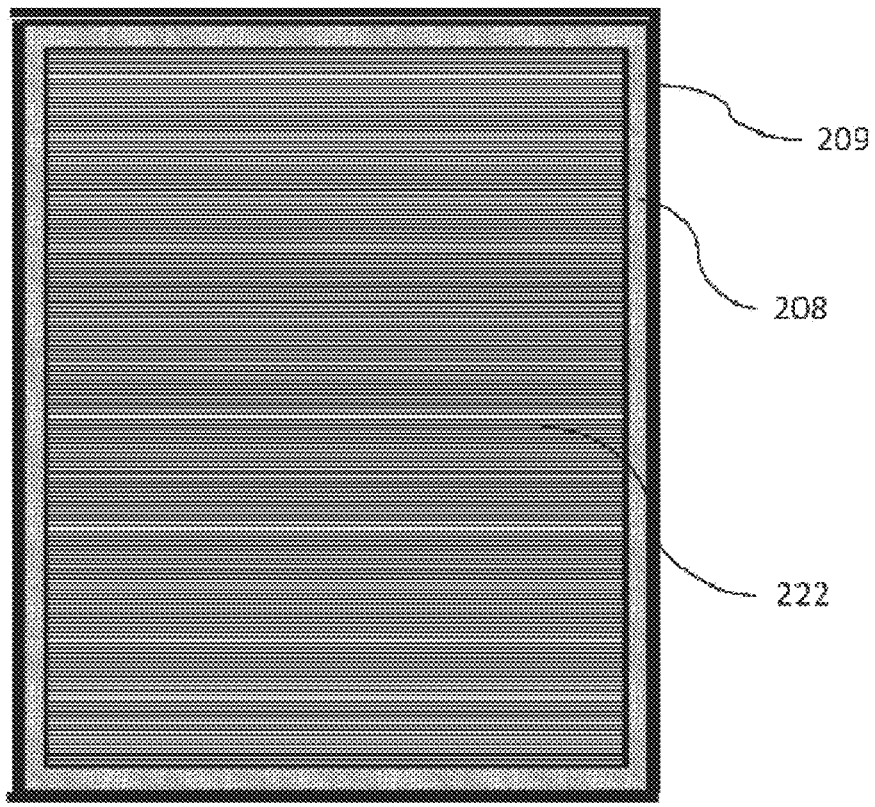
FIG. 7B shows a top view of the same example assembly shown in FIG. 7A.
Figure 8A:
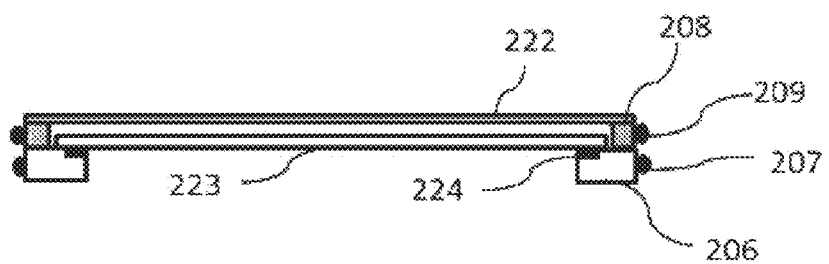
FIG. 8A shows a side view of an example mask assembly according to an embodiment of the invention
Figure 8B:
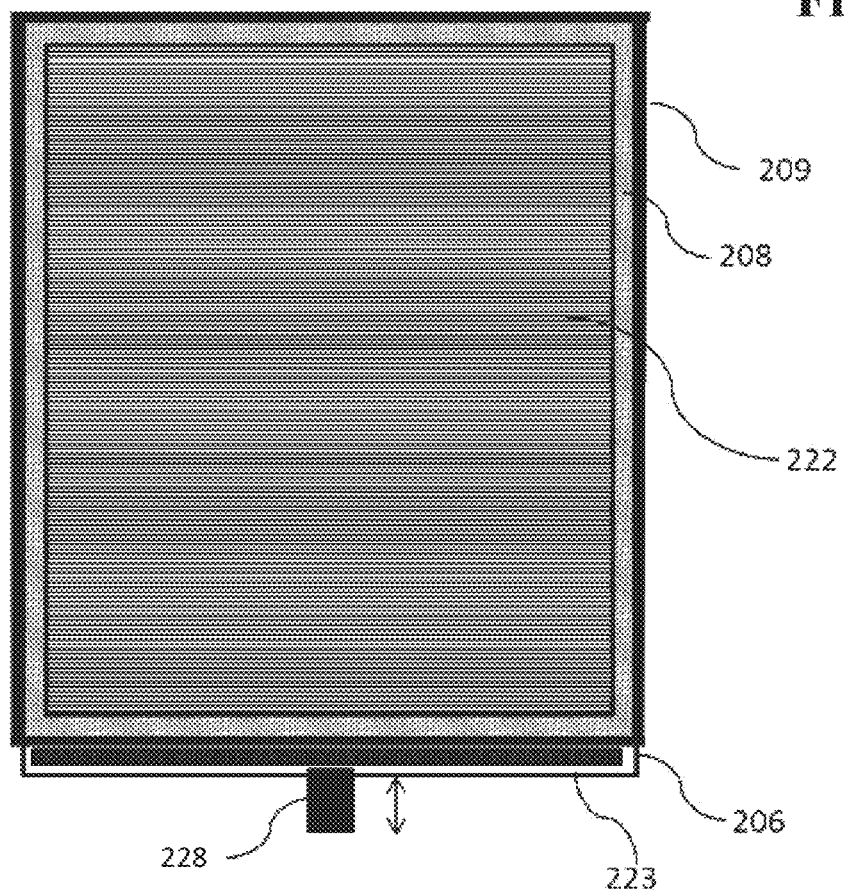
FIG. 8B shows a top view of the same example assembly shown in FIG. 8A.

FIG. 7A and FIG. 8A show side views of example mask assemblies according to an embodiment of the invention; FIG. 7B and FIG. 8B show top views of the same assemblies, respectively. The mask assembly may include a mask support structure 208, shadow masks 222, and a mask assembly 206,

207, 223 224. The size of the mask assembly may be selected as an even fraction of the width and/or length of the substrate, for example ½, ¼, ⅙, etc. of the width of the substrate, so that an integral number of mask assemblies can be used to span the width and length of the substrate with no overlap or waste, and/or an integral number of step movements of the assembly will span the width and length of the substrate. The mask support structure may be made from high thermal conductivity material, such as copper or tungsten, and may be actively cooled by a chiller, such as through cooling channels in or on the mask support structure 209. The shadow mask 222 may be a thin metal mask, and may be rigidly attached to the support structure 208 in a manner that provides good thermal contact to the support structure and/or provides tension on the mask.

The mask assembly may include one or more lower portions 206, 207, 223, 224, which may be disposed under a top shadow mask portion. The lower mask assembly portion may have one or more openings that correlate with the openings in the top mask portion. Thus, the lower mask portion may be moved in one direction to allow the openings to be coincident with the top mask portion openings during deposition, and occluded when no deposition is desired. As an example, a piezo-electric actuator 228 may be used to move the lower mask portion from the coincident to occluded position and vice-versa. For relatively large masks and shutters, multiple actuators may be used. The lower mask portion may be disposed within a frame 206 having a bearing surface 224, and may be coated with a low friction material such as diamond-like carbon (DLC). The mating surface of the mask similarly may be coated with a friction reducing coating. More generally, a mask assembly as disclosed herein may include one or more portions that can be actuated or moved relative to one another to achieve a desired relative and/or absolute opening size, thereby controlling deposition as disclosed herein. It will be understood that the specific arrangements, actuators, materials, and connections illustrated in FIGS. 7A, 7B, 8A, and 8B are illustrative only, and that other configurations may be used without departing from the scope of the invention.

Figure 9B:
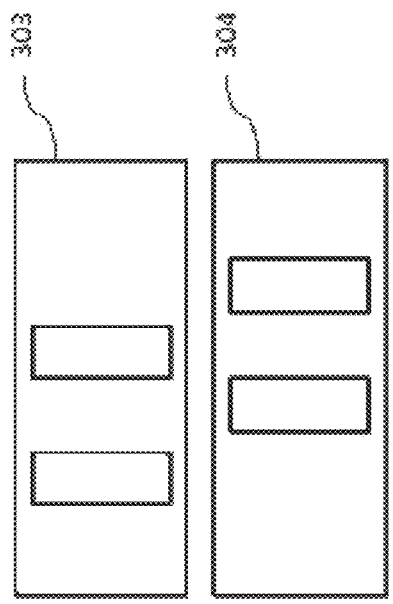
FIG. 9B shows a schematic top view of segments of the adjustable mask shown in FIG. 9A.
Figure 9C:
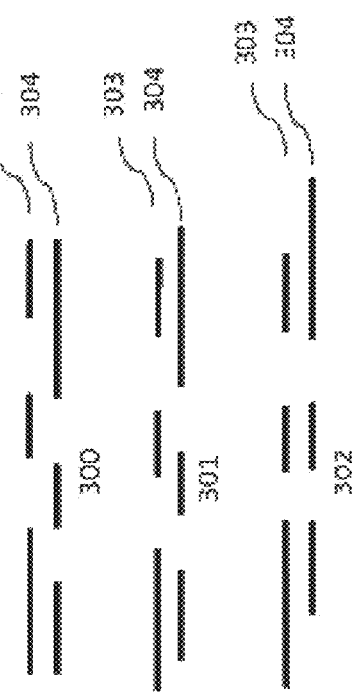
FIG. 9C shows a schematic side view of the adjustable mask segments shown in FIGS. 9A and 9B in several positions.
Figure 9A:
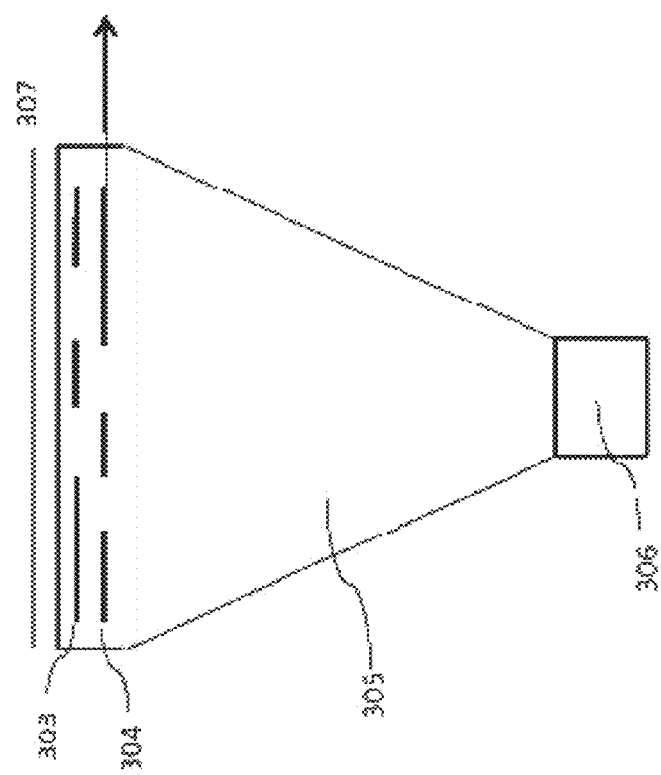
FIG. 9A shows a schematic representation of a device having an adjustable mask assembly according to an embodiment of the invention.

FIG. 9A shows a schematic representation of a device having an adjustable mask assembly according to an embodiment of the invention. FIG. 9B shows a schematic top view of segments of the adjustable mask shown in FIG. 9A. FIG. 9C shows a schematic side view of the adjustable mask segments shown in FIGS. 9A and 9B in several positions. As shown in FIG. 9C, the mask portions may be moved relative to one another to provide completely occluded overlap 300, partial occlusion 301, or full open mask features 302. The mask assembly 303, 304 may be disposed above the source assembly 305 and vaporizer 306 as previously described. This moveable mask assembly also may be used as a shutter when in position 300, to completely stop deposition of material on a substrate. During operation, the mask may become coated with deposition material, causing the size of the pattern deposited to shrink as the mask becomes coated. To compensate for this pattern shrinkage, the mask assembly may include one or more portions 303, 304. In some configurations, one pattern may be displaced on the mask relative to the other. In general, any size and pattern of openings may be used for each mask portion. One mask portion 303 may be fixed in position, and at least one mask portion 304 may be moveable in at least one direction. Thus, movement of the moveable portions 304 may provide one or more adjustable mask openings. The patterns may be larger than the desired pattern in either one or two directions. When the openings are aligned, the mask openings are at maximum size, and when the mask portions are disposed such that the openings do not overlap, the pattern is blocked and no material passes through the mask. When the mask is used as a shutter as described herein, it may be preferred for the mask opening to be at most 50% of the area of the mask, when the mask portions are aligned to provide the maximum mask opening. However, if the mask is not to be used as a shutter, larger openings may be used. By moving the masks between these two extremes, the masks can be used to compensate for coating deposited on the mask as described herein.

Referring to FIG. 9C, the starting or "clean" position of the masks may be the partially occluded position 301. As the mask becomes coated with sublimated material, the mask may be moved to enlarge the opening 302, thus maintaining a consistent rate and thickness of deposition, despite material buildup that may occur on some or all of the mask. As previously described, in the fully-occluded position 300, the mask may operate as a shutter to completely stop deposition, without requiring the vaporizer temperature to be changed. In configurations in which one of the mask portions is moveable, there may be a translation of the pattern on the substrate 307 in the direction of the mask opening, as shown in FIG. 9A. This translation may be corrected by making both mask portions moveable in opposite directions, or by shifting the source assembly in the direction opposite of the mask openings.

Figure 10:
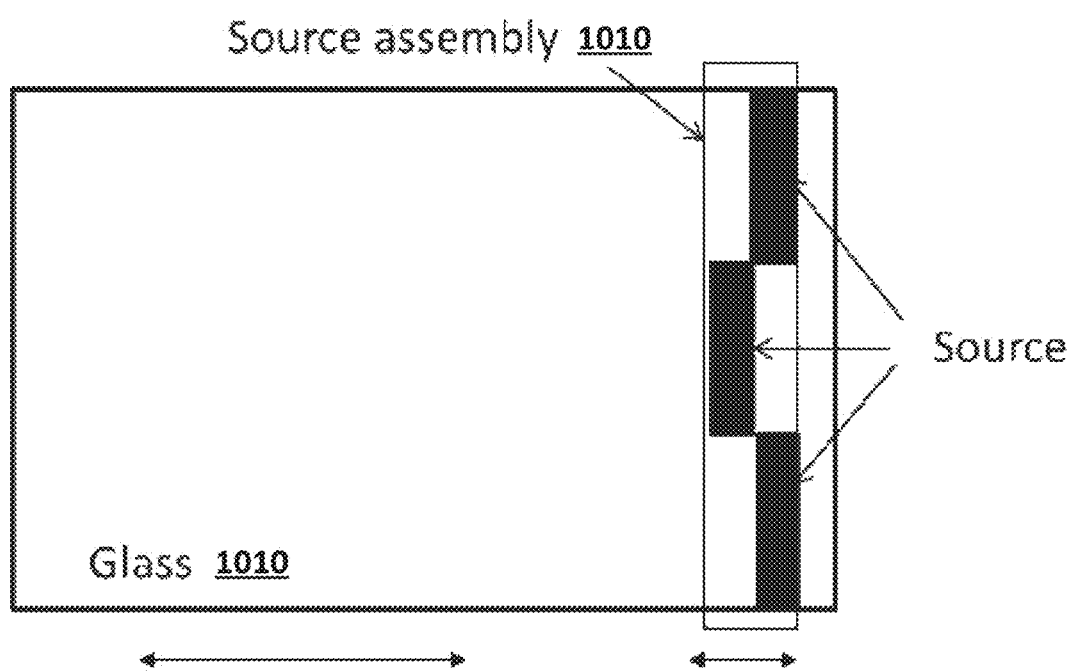
FIG. 10 shows a schematic illustration of a system having a source assembly with multiple sources according to an embodiment of the invention.
Figure 10:
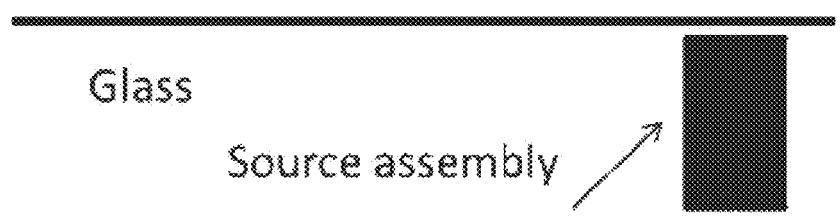

In general, vaporizers as disclosed herein may be capable of depositing multiple materials. In some configurations, multiple mask assemblies may be used, one for each material to be deposited, such as where one mask assembly is used for each color to be deposited in a multi-color display or a white-emitting lighting panel. In some embodiments, individual vaporizers may be used for only one material or for only a single color, which may include host and dopant materials. In such a configuration, a deposition system as disclosed herein may include multiple vaporizer assemblies as previously described, such as shown in FIGS. 6A and 6B. Multiple source assemblies may be used to increase throughput of a deposition system by depositing from multiple sources on one panel. Using multiple sources also may improve the scalability of the system by simply increasing the number of source assemblies to span larger distances. In this manner, an individual source may not need to be re-engineered, and issues of mask distortion and vaporizer scaling may be avoided. FIG. 10 shows a schematic illustration of a system having a source assembly with multiple sources. The substrate 1010, shown in FIG. 10 as a glass substrate, may be moved above the source assembly 1020 to provide the major motion. In some configurations, mounting rails or similar arrangements of the source assembly may provide a relatively small range of motion for fine alignment in x, y and z directions. Multiple source assemblies can be used, such as to increase throughput and for individual colors or layers in a display.

Devices and techniques disclosed herein may be used to deposit a variety of materials on a substrate, including organic materials, organic emissive materials, and the like. In some configurations, a material source in a vaporizer as disclosed may include multiple materials, such as where two materials are to be co-deposited in a single layer of an OLED or similar device.

In an embodiment of the invention, a material may be deposited on a substrate by vaporizing the material between cooled side walls and toward a mask assembly. The mask assembly may have an adjustable opening as disclosed herein, and may be disposed not more than 5 W, not more than 4 W, or less, from the mask assembly, where W is the width of the mask assembly. Various issues known to occur with mask deposition systems may be addressed in a variety of ways, including adjusting the distance between the mask assembly and the vaporizer, and/or increasing or decreasing the width of the mask opening. For example, as previously described, in an embodiment the mask opening may be increased to adjust for material buildup that occurs during operation.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting. Multiple materials may be vaporized and deposited, such as where multiple vaporizers are operated to vaporize multiple materials between the cooled side walls.

The invention claimed is:

1. A device comprising:
    a first thermal vaporizer;
    a mask assembly comprising an adjustable mask opening and disposed not more than a distance 5 W from the first thermal vaporizer, wherein W is the width of the mask assembly; and
    a first plurality of cooled side walls disposed between the first thermal vaporizer and the mask assembly and defining a material sublimation region.

2. The device of claim 1, wherein mask assembly is disposed not more than 4 W from the first thermal vaporizer.

3. The device of claim 1, wherein the mask assembly is disposed at least 100 μm-1 cm from the first thermal vaporizer.

4. The device of claim 1, wherein the mask assembly is disposed 1 mm-5 mm from the material source.

5. The device of claim 1, wherein the mask assembly comprises a plurality of components moveable relative to one another to adjust the area of the mask opening.

6. The device of claim 1, wherein the mask opening is adjustable between a fully closed position and an open position.

7. The device of claim 6, wherein, when the mask opening is fully closed, source material provided by the first thermal vaporizer is entirely prevented from passing through the mask.

8. The device of claim 1, wherein the mask opening has a maximum area of not more than 50% of the area of the mask.

9. The device of claim 1, further comprising an organic material source disposed within the first thermal vaporizer.

10. The device of claim 1, further comprising a second vaporizer.

11. The device of claim 10, further comprising a second plurality of cooled side walls disposed between the second vaporizer and the mask assembly.

12. The device of claim 10, each vaporizer configured to vaporize a separate material.

13. The device of claim 1, further comprising a vacuum source in fluid communication with the material sublimation region.

14. The device of claim 1, wherein at least a portion of the mask assembly is cooled.

15. A deposition system comprising:
    a device as recited in claim 1; and
    a target substrate;
    wherein the mask assembly has an area less than the area of the target substrate.

16. A method for fabricating a device, the method comprising:
    vaporizing a first material between a first plurality of cooled side walls and toward a mask assembly having an adjustable mask opening and disposed not more than a distance 5 W from the first material, wherein W is a width of the mask assembly.

17. The method of claim 16, further comprising:
    changing the width of the adjustable mask opening.

18. The method of claim 16, further comprising:
    vaporizing a second material toward the mask assembly.

19. The method of claim 18, further comprising:
    rastering a substrate relative to the mask and source assembly containing a second material to cover a surface of a substrate.

20. The method of claim 16, further comprising:
    rastering a substrate relative to the mask and source assembly containing a first material to cover a surface of a substrate.

* * * * *